United States Patent [19]

Slate et al.

[11] Patent Number: 5,001,670
[45] Date of Patent: Mar. 19, 1991

[54] NONVOLATILE MEMORY PROTECTION

[75] Inventors: Timothy W. Slate; Bruce J. Penney, both of Portland, Oreg.

[73] Assignee: Tektronix, Inc., Beaverton, Oreg.

[21] Appl. No.: 11,956

[22] Filed: Feb. 6, 1987

[51] Int. Cl.[5] ............................................. G11C 00/00
[52] U.S. Cl. .................................... 365/228; 365/229; 365/189.01
[58] Field of Search ................ 365/228, 201, 189, 229

[56] References Cited

U.S. PATENT DOCUMENTS

| | | | |
|---|---|---|---|
| 4,104,734 | 8/1978 | Herndon | 365/228 |
| 4,198,698 | 4/1980 | Ong et al. | 365/228 X |
| 4,610,003 | 9/1986 | Natori | 365/228 |
| 4,612,632 | 9/1986 | Olson | 365/228 X |
| 4,631,707 | 12/1986 | Watanabe | 365/228 X |
| 4,638,465 | 1/1987 | Rosini et al. | 365/228 |
| 4,672,585 | 6/1987 | Nollet | 365/228 |

Primary Examiner—Stuart N. Hecker
Assistant Examiner—Alyssa H. Bowler
Attorney, Agent, or Firm—Francis I. Gray

[57] ABSTRACT

A nonvolatile memory protection system for a microprocessor system having a common address bus, to which a nonvolatile memory is connected, interposes a controller connected to the common address bus between the commands generated by the microprocessor and the nonvolatile memory. The controller generates valid commands for the nonvolatile memory upon receiving a predetermined sequence of commands from the microprocessor, disabling the nonvolatile memory in the absence of valid commands. A power protect circuit connected between the microprocessor system power supply and the nonvolatile memory provides a disable signal to the nonvolatile memory during power up and power down of the microprocessor system.

10 Claims, 3 Drawing Sheets

NONVOLATILE MEMORY PROTECTION

BACKGROUND OF THE INVENTION

The present invention relates to computer memory protection, and more particularly to nonvolatile memory protection which prevents data errors when a microprocessor executes erroneous instructions during normal operations and during power up and power down.

A nonvolatile memory, as shown in FIG. 1, has two components, a random access memory (RAM) which acts upon every command received and an electrically erasable programmable read only memory ($E_2PROM$) which can accept only a limited number of WRITEs to the $E_2PROM$ portion until it will no longer retain data when power is removed. During microprocessor execution of software code it is possible for spurious commands to be generated which cause erroneous WRITEs to the $E_2PROM$ portion of the nonvolatile memory, either randomly or in a continuous stream. Such erroneous WRITEs can destroy the $E_2PROM$ portion of the nonvolatile memory, rendering it useless. Another source of spurious microprocessor commands which may cause erroneous writes to the nonvolatile memory is the power supply. During power up or down of the microprocessor system not all parts of the system are powered up or down instantaneously together, providing the opportunity for spurious commands either while the system is powering up or down.

What is desired is a method for protecting the nonvolatile memory from such spurious commands to maintain the integrity of the data in the memory.

SUMMARY OF THE INVENTION

Accordingly the present invention provides a nonvolatile memory protection system which combined software with hardware to improve system reliability. A memory controller is inserted between a microprocessor and a nonvolatile memory to intercept commands addressed to the nonvolatile memory before they are executed. The controller looks at the address bits from a common address bus for each command from the microprocessor to determine whether the nonvolatile memory is to be accessed. Before a command is forwarded to the nonvolatile memory from the controller for execution, a sequence of commands with predetermined address bits is received from the microprocessor. If the sequence is correct, a command is forwarded from the controller to the nonvolatile memory for execution. Thus, spurious commands are blocked by the controller, protecting data integrity.

A transistor circuit provides protection during power up and power down by applying a save signal to disable the nonvolatile memory. The save signal is maintained high during power up by a power reset signal from the power supply through a logic circuit. During power down a capacitor in the emitter, which has been charged to the power supply voltage, causes the transistor to conduct, maintaining the save signal high. Thus the nonvolatile memory is disabled for commands during the power up and down phases.

The objects, advantages and novel features of the present invention will be apparent from the following detailed description when read in conjunction with the appended claims and attached drawing.

DESCRIPTION OF THE PREFERRED EMBODIMENT

Figure 1:
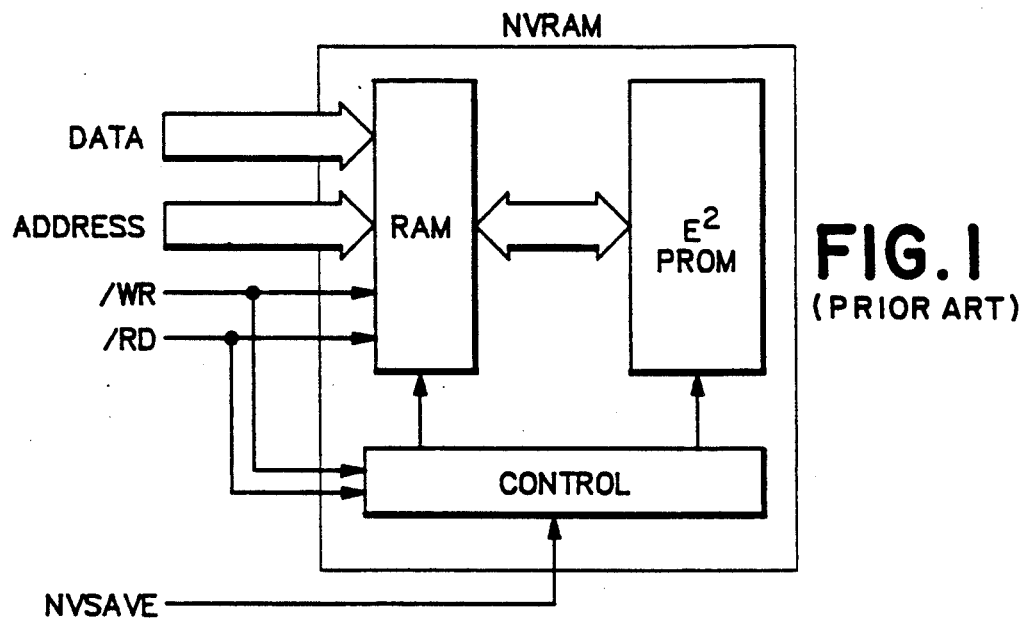
FIG. 1 is a block diagram of a typical nonvolatile memory.
Figure 2:
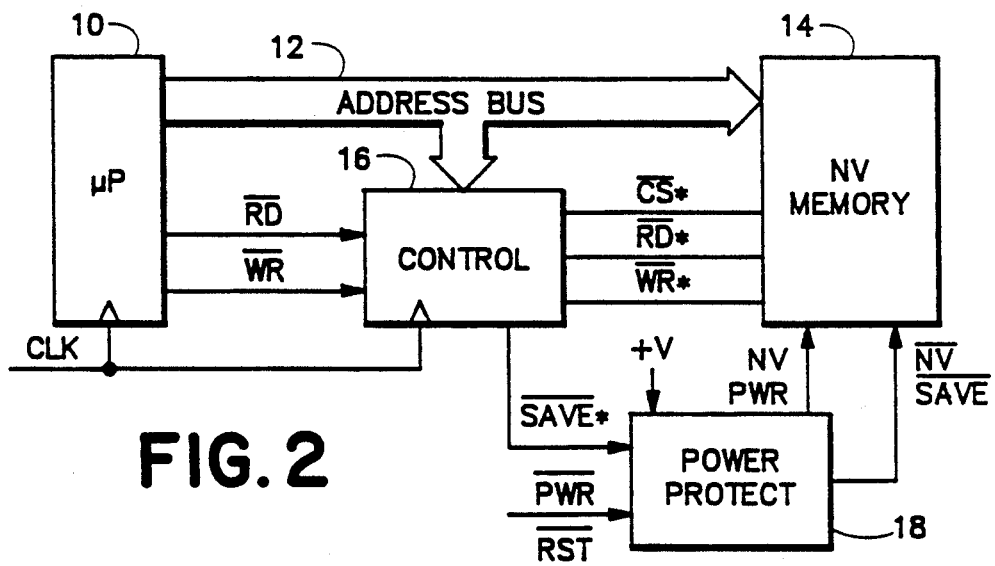
FIG. 2 is a block diagram of a portion of a microprocessor system having nonvolatile memory protection according to the present invention.
Figure 3:
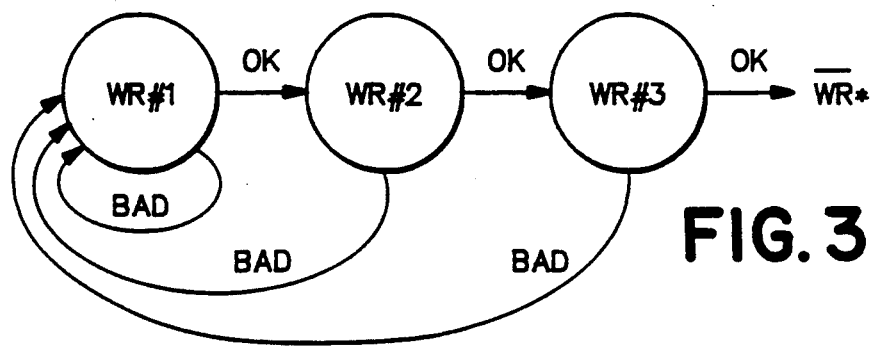
FIG. 3 is a general flow chart of the software for the controller of FIG. 2.

Referring now to FIG. 2 a microprocessor 10 has an address bus 12 to which a nonvolatile memory 14 and a controller 16 are connected. The microprocessor 12 and controller 16 are clocked by a common clock CLK. Read (/RD) and write (/WR) commands together with a selected portion of the bits of the address from the address bus 12 are input to the controller 16. From the /RD, /WR and the selected portion of the address bits the controller 16 derives chip select (/CS*), read (/RD*) and write (/WR*) commands which are applied to the nonvolatile memory 14 to perform the desired read or write operation. As indicated in FIG. 3 the controller 16 generates the /WR* command only upon receiving a predetermined sequence of write commands. If any write commands in the sequence are incorrect, no /WR* command will be applied to the nonvolatile memory 14 from the controller 16.

A power protect circuit 18 receives power (+V) and a power reset signal (/PWRRST) from a power supply (not shown) as well as a signal (/SAVE*) from the controller 16. As will be discussed with reference to FIG. 4 /SAVE* from the controller 16 and /PWRRST cause the power protect circuit 18 to generate a protect signal (/NVSAVE) which is applied to the nonvolatile memory 14 during power up and during the period when no valid command for the memory is received from the microprocessor 10 to disable the nonvolatile memory 14. The power protect circuit 18 applies power (NVPWR) to the nonvolatile memory 14 which is derived from +V of the power supply. During power down the power protect circuit, as will be described later, automatically applies /NVSAVE to the nonvolatile memory 14, disabling the memory from receiving commands.

Figure 4:
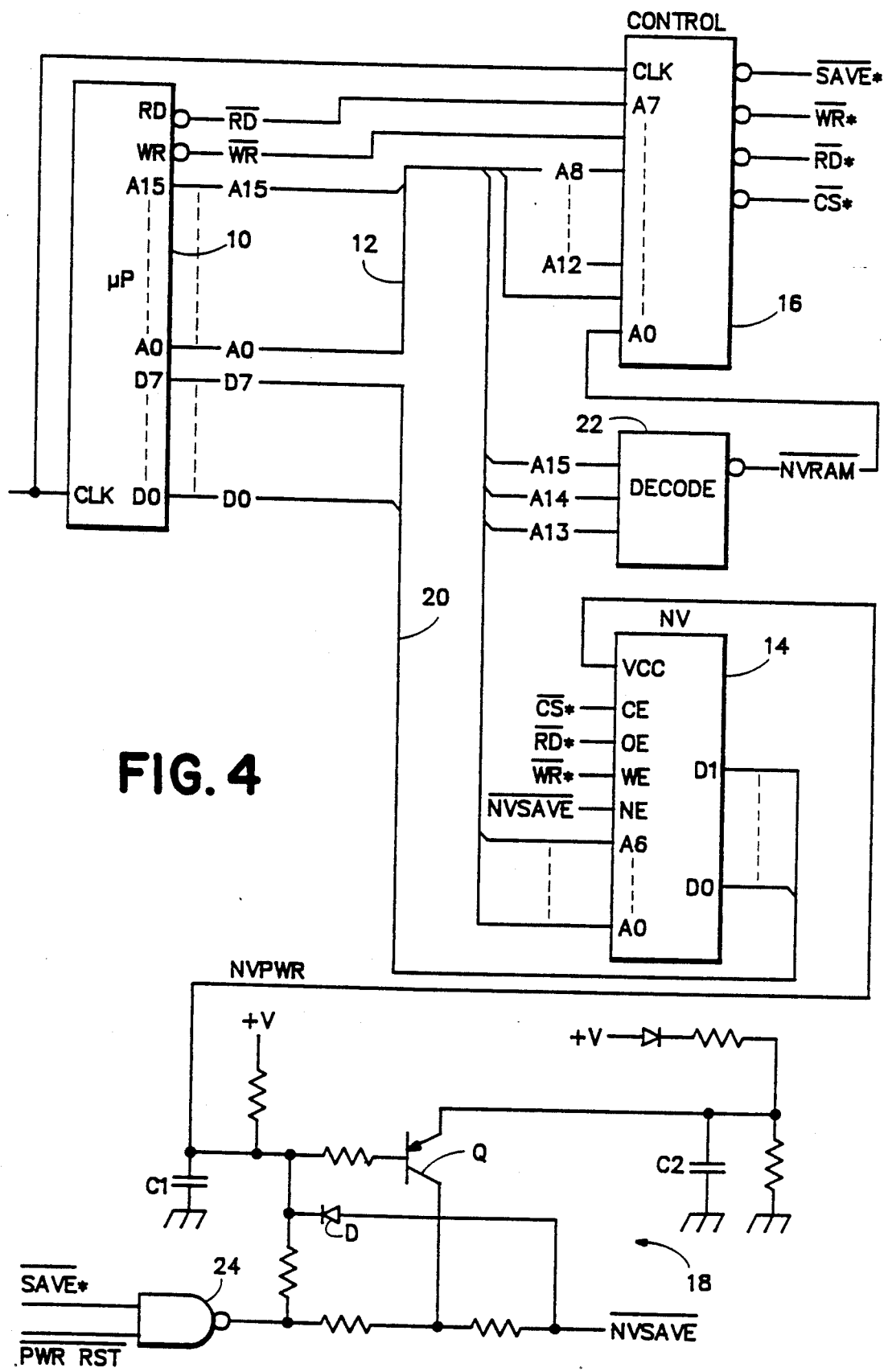
FIG. 4 is a schematic diagram of the microprocessor system of FIG. 2.

As shown in FIG. 4 as an example of one embodiment the microprocessor 10 has a sixteen bit address bus 12. The eight most significant bits are used to identify specific equipment connected to the address bus 12 which are to be accessed by that particular command from the microprocessor 10. The other typical types of equipment associated with a microprocessor system, such as working memories (RAMs), input/output devices and the like, are not shown, but would be connected to the address bus as well for access by the microprocessor. The eight least significant bits are the actual address within the identified equipment to which a data word is to be written or from which a data word is to be read. A data bus 20 connects equipment to the microprocessor 10 to which data is to be written or from which data is to be read. Specifically for this embodiment the data bus 20 connects the nonvolatile memory 14 to the microprocessor 10. The three most significant bits of the address word from the address bus 12 are input to a decode circuit 22 which outputs a signal /NVRAM when a command is intended for the nonvolatile memory 14. The remaining most significant bits of the address word, together with /NVRAM from the decode circuit 22 and /RD, /WR from the microprocessor 10, are input to the controller 16.

From the controller 16 are output /SAVE*, /WR*, RD* and /CS*, where /CS* is the actual chip select command which selects the nonvolatile memory 14 and which is derived from /NVRAM and one of the remaining most significant bits. /SAVE* is input to a gate 24, the output of which is /NVSAVE to disable the nonvolatile memory 14 when no valid commands are accessing the memory. /CS*, /RD* and /WR* commands are input from the controller 16 to the nonvolatile memory 14 to cause data to be read from the address specified by the least significant bits of the address word, or to cause data to be written into the address specified by the least significant bits of the address. If the proper sequence of addresses is not received, then data will not be transferred to or from the RAM and E2PROM portions of the nonvolatile memory 14.

The output of the gate 24 is in the collector circuit of a transistor Q. NVPWR is derived from the base circuit of the transistor Q having first capacitor C1. The capacitor C1 acts as a filter to short any a.c. component of NVPWR, or the power supply voltage +V, to ground so only d.c. is applied to the nonvolatile memory 14. In the emitter circuit of the transistor Q is a second capacitor C2 to store energy as the power supply drops at power off. A diode D is connected between NVPWR and /NVSAVE to prevent /NVSAVE from being more than one diode drop higher than NVPWR during power down phase.

In operation when the power supply is turned on during the power up phase, a power reset signal (/PWRRST) is input to the gate 24. The output of the gate 24 is high so long as /PWRRST is present, causing NVSAVE to disable the nonvolatile memory 14. Once the power up phase is complete, /PWRRST changes state and the output of the gate 24 is determined by /SAVE* from the controller 16.

Figure 5:
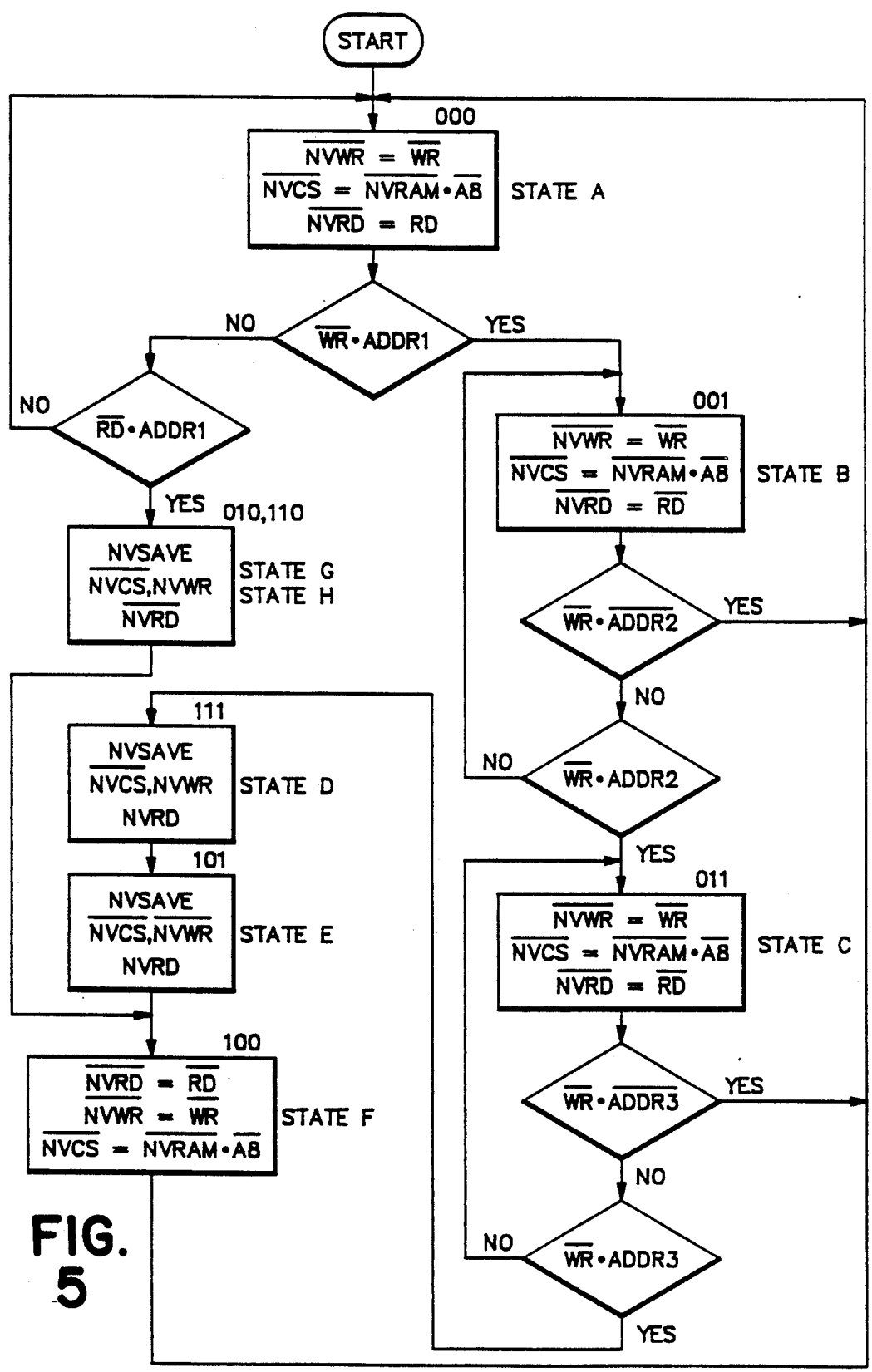
FIG. 5 is a flow chart of the software for the controller of FIG. 4.

As is apparent from FIG. 5 the controller 16 is a state machine having some initial state A which allows reading and writing to the RAM portion of the nonvolatile memory 14. The first command addressed to the nonvolatile memory 14 is tested to determine whether it is a write command with the proper address in the most significant bits. If this test fails, then the command is tested to determine whether it is a read command with the proper address in the most significant bits. If both tests fail, the controller 16 cycles back to its initial state A. If the read command is proper, the controller 16 goes to the read states G, H which removes /NVSAVE to enable the nonvolatile memory 14, selects the nonvolatile memory with /CS* (/NVCS), and transfers data from the E2PROM portion of the memory to the RAM portion from the address specified by the least significant bits of the address word on the address bus 12 from the memory (/NVRD, NVWR=/RD*, WR*) for access to the data bus 20. The controller 16 then cycles through state F which is a no operation state before returning to the initial state A for the next command from the microprocessor 10.

If the write command is proper, the controller 16 proceeds to a no operation state B to await a second command from the microprocessor 10. The next command is tested to determine whether it is a write command with the proper second address in the most significant bits of the address word. If the command is a write command with the wrong address or a read command, the controller 16 returns to the initial state A. If the command is proper the controller 16 proceeds to a second no operation state C to await a third command from the microprocessor 10. Again the command is tested to determine whether it is a write command with a proper third address, and if the command is improper, the controller 16 returns to the initial state A. If the command is proper, the controller 16 proceeds to state D where the nonvolatile memory 14 is enabled, and then to state E where the data word from the data bus 20 is transferred from the RAM portion of the nonvolatile memory 14 to the E2PROM portion at the address determined by the least significant bits of the address word on the address bus 12. The controller 16 then cycles back through state F to the initial state A.

During the power off phase NVPWR decays rapidly, but not instantaneously, as capacitor C1 discharges. The capacitor C2 in the transistor Q emitter circuit has been charged up almost to +V, and is large enough so that it discharges more slowly than C1 when +V is removed by power supply turn off. This biases transistor Q on, applying the voltage at C2, less the transistor Q drop, to the collector resulting in NVSAVE being pulled high to protect the nonvolatile memory 14. The diode D assures that /NVSAVE is not more than one diode drop greater than NVPWR to protect the memory 14 from excessively high voltage at the NVSAVE input.

Thus the present invention provides nonvolatile memory protection by requiring a specific command sequence before a command is applied to the nonvolatile memory, and by automatically disabling the memory during power up and power down.

What is claimed is:

1. A protection system for a nonvolatile memory connected to a microprocessor via an address bus comprising:

a controller connected between the microprocessor and the nonvolatile memory, the controller having as inputs the address bus and commands from the microprocessor and having as outputs valid commands and a memory select signal for input to the nonvolatile memory, the controller generating the valid commands and the memory select signal when a predetermined sequence of commands is received from the microprocessor having associated specified addresses from the address bus; and means for disabling the nonvolatile memory from receiving commands in the absence of valid commands.

2. A protection system as recited in claim 1 wherein the disabling means comprises:

means for generating a disable signal for application to the nonvolatile memory during power up and power down of the microprocessor; and means for applying a signal from the controller as the disable signal to the nonvolatile memory in the absence of valid commands.

3. A protection system as recited in claim 2 wherein the generating means comprises:

a logic gate having as inputs a power reset signal during power up and a save signal from the controller in the absence of valid commands; and a transistor circuit having a base circuit, an emitter circuit and a collector circuit, the output of the logic gate being connected to the collector circuit from which the disable signal is derived, the base circuit being connected to the nonvolatile memory to provide a power signal, and the emitter circuit including means for generating the disable signal during power down.

4. A protection system as recited in claim 3 wherein the generating means in the emitter circuit comprises a capacitor having sufficient stored energy to enable the transistor circuit to conduct to generate the disable signal in the collector circuit during power down.

5. A method for protecting nonvolatile memory in a microprocessor system having a microprocessor, a nonvolatile memory and a common memory bus comprising the steps of:

testing commands from the microprocessor via a controller connected between the microprocessor and the nonvolatile memory to detect the presence of a predetermined command sequence;

generating valid commands from the controller for application to the nonvolatile memory when the presence of the predetermined command sequence is detected; and disabling the nonvolatile memory from receiving commands in the absence of valid commands.

6. A protection system as recited in claim 1 further comprising:

means for applying a signal from a power supply for the microprocessor system as a disable signal to the nonvolatile memory during power up of the power supply; and means for automatically generating the disable signal during power down of the power supply.

7. A protection system as recited in claim 6 wherein the applying means comprises a logic gate having as an input a power reset signal during power up and as an output the disable signal.

8. A protection system as recited in claim 7 wherein the generating means comprises a transistor circuit having a base circuit, an emitter circuit and a collector circuit, the output of the logic gate being connected to the collector circuit, the base circuit being connected to the nonvolatile memory to provide a power signal, and the emitter circuit including means for generating the disable signal during power down.

9. A protection system as recited in claim 8 wherein the generating means in the emitter circuit comprises a capacitor having sufficient stored energy to enable the transistor circuit to conduct to generate the disable signal in the collector circuit during power down.

10. A method as recited in claim 5 further comprising the steps of:

applying a signal from a power supply for the microprocessor system as a disable signal to the nonvolatile memory during power up of the power supply; and generating the disable signal automatically during power down of the power supply for application to the nonvolative memory;

whereby during power up and power down the nonvolatile memory is disabled from receiving commands.

* * * * *